US010157798B1

(12) United States Patent
Chi et al.

(10) Patent No.: US 10,157,798 B1
(45) Date of Patent: Dec. 18, 2018

(54) UNIFORM BOTTOM SPACERS IN VERTICAL FIELD EFFECT TRANSISTORS

(71) Applicant: INTERNATIONAL BUSINESS MACHINES CORPORATION, Armonk, NY (US)

(72) Inventors: Cheng Chi, Jersey City, NJ (US); Min Gyu Sung, Latham, NY (US); Ruilong Xie, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/808,467

(22) Filed: Nov. 9, 2017

(51) Int. Cl.
*H01L 29/78* (2006.01)
*H01L 21/8234* (2006.01)
*H01L 21/336* (2006.01)
*H01L 29/66* (2006.01)

(52) U.S. Cl.
CPC ........ *H01L 21/823487* (2013.01); *H01L 21/823468* (2013.01); *H01L 29/66666* (2013.01); *H01L 29/7827* (2013.01)

(58) Field of Classification Search
CPC ....... H01L 21/823487; H01L 29/66666; H01L 29/7827
See application file for complete search history.

(56) References Cited

U.S. PATENT DOCUMENTS

| 9,530,863 | B1 | 12/2016 | Zhang et al. |
| 9,627,511 | B1 | 4/2017 | Cheng et al. |
| 9,640,636 | B1 | 5/2017 | Bentley et al. |
| 9,647,123 | B1 | 5/2017 | Balakrishnan et al. |
| 9,711,618 | B1 | 7/2017 | Cheng et al. |
| 9,741,626 | B1 | 8/2017 | Cheng et al. |
| 2017/0243974 | A1 | 8/2017 | Mallela |

OTHER PUBLICATIONS

Kangguo Cheng, et al., "Vertical Field Effect Transistor With Reduced Parasitic Capacitance", U.S. Appl. No. 15/479,567, filed Apr. 5, 2017.

*Primary Examiner* — Robert Bachner
*Assistant Examiner* — Molly Reida
(74) *Attorney, Agent, or Firm* — Cantor Colburn LLP; David Quinn

(57) ABSTRACT

A method for forming a semiconductor device includes forming a semiconductor fin over a surface of a substrate and forming sacrificial spacers on first and second sides of the semiconductor fin. The first side opposes the second side. The method includes recessing the surface to expose second and third surfaces, recessing the second surface to form a first cavity between the sacrificial spacers and the substrate on the first side, and recessing the third surface to form a second cavity between the sacrificial spacers and the substrate on the second side. The method includes forming a first bottom spacer in the first cavity and forming a second bottom spacer in the second cavity. A thickness of the first bottom spacer in a direction between the sacrificial spacers and the substrate is substantially equal to a thickness of the second bottom spacer in the same direction.

13 Claims, 14 Drawing Sheets

UNIFORM BOTTOM SPACERS IN VERTICAL FIELD EFFECT TRANSISTORS

BACKGROUND

The present invention relates in general to semiconductor devices, and more specifically, to fabrication methodologies and resulting structures for vertical field effect transistors (VFETs) having uniform bottom spacers.

In contemporary semiconductor device fabrication processes, a large number of semiconductor devices, such as field effect transistors (FETs), are fabricated on a single wafer. Some non-planar transistor architectures, such as VFETs, employ semiconductor fins and side-gates that can be contacted outside the active region, resulting in increased device density and some increased performance over lateral devices. In VFETs, the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

Some non-planar transistor device architectures, such as VFETs, employ semiconductor fins and side-gates that can be contacted outside the active region, resulting in increased device density over lateral devices. When forming VFETs, bottom spacers need to be provided between and around vertical structures.

Forming the bottom spacers of a VFET by directional deposition techniques (e.g., high-density plasma deposition (HDP), physical vapor deposition (PVD), or gas clustering ion beam deposition (GCIB), etc.) can be problematic due to fin tapering and the high aspect ratio of the fin structure. Although directional deposition onto a structure should result in deposition on the co-planar surfaces perpendicular to the direction of the deposition, in practice deposition can affect the non-planar surfaces as well. Thus, additional etching processes are needed to remove the parasitic deposition on the non-planar surfaces, which results in bottom spacer thickness variation.

SUMMARY

The current invention is directed to systems and methods for fabricating VFET devices in a manner that allows for formation of uniform bottom spacers. In a non-limiting example of the invention, the systems and methods include directional, e.g., lateral, semiconductor etching, which enables uniform bottom spacers to be formed.

Embodiments of the present invention are directed to a method for forming a semiconductor device. A non-limiting example of the method includes forming a semiconductor fin over a first surface of a substrate and forming sacrificial spacers on a first side of the semiconductor fin and a second side of the semiconductor fin. The first side of the semiconductor fin opposes the second side of the semiconductor fin. The method includes recessing the first surface of the substrate to expose a second surface of the substrate and a third surface of the substrate, recessing the second surface of the substrate to form a first cavity between a first portion of the sacrificial spacers and the substrate on the first side of the semiconductor fin, and recessing the third surface of the substrate to form a second cavity between a second portion of the sacrificial spacers and the substrate on the second side of the semiconductor fin. The method includes forming a first bottom spacer in the first cavity and forming a second bottom spacer in the second cavity. A thickness of the first bottom spacer in a direction between the first portion of the sacrificial spacers and the substrate is substantially equal to a thickness of the second bottom spacer in the direction between the second portion of the sacrificial spacers and the substrate.

Recessing the surfaces of the substrate provides the technical benefit of precision is etching. Consequently, bottom spacers with uniform thicknesses can be formed.

Embodiments of the present invention are directed to a semiconductor device. A non-limiting example of the semiconductor device includes a semiconductor fin over a substrate, a conductive gate contacting the semiconductor fin, and a first bottom spacer on a first side of the semiconductor fin. The first bottom spacer is between the conductive gate and the substrate. The semiconductor device includes a second bottom spacer on a second side of the semiconductor fin. The second bottom spacer is between the conductive gate and the substrate. The second side of the semiconductor fin opposes the first side of the semiconductor fin. A thickness of the first bottom spacer in a direction between the conductive gate and the substrate is substantially equal to a thickness of the second bottom spacer in the direction between the conductive gate and the substrate. Each of the first bottom spacer and the second bottom spacer includes silicon nitride.

The substantially equal thicknesses of the first and second bottom spacers provides the advantage of addressing bottom spacer thickness variation issues related with the conventional methods as described above.

In embodiments of the invention, the semiconductor device can further include a third bottom spacer, the first bottom spacer being between the third bottom spacer and the semiconductor fin, and the thickness of the first bottom spacer can be greater than a thickness of the third bottom spacer in the direction between the conductive gate and the substrate. In this manner, a VFET device having reduced parasitic capacitance is provided. Thus, the technical benefit of achieving decreased a parasitic capacitance of the device can be realized by increasing a distance separating portions of the conductive gate in non-channel regions from a bottom source or drain region of the device.

Embodiments of the present invention are directed to a semiconductor device. A non-limiting example of the semiconductor device includes a first semiconductor fin over a substrate, a second semiconductor fin on the substrate, a conductive gate between and contacting the first semiconductor fin and the second semiconductor fin, and a first bottom spacer on a first side of the first semiconductor fin. The first bottom spacer is between the conductive gate and the substrate. The semiconductor device includes a second bottom spacer on a second side of the first semiconductor fin. The second bottom spacer is between the conductive gate and the substrate. The second side of the first semiconductor fin opposes the first side of the first semiconductor fin. The second bottom spacer is on a first side of the second semiconductor fin. The second bottom spacer includes a first portion including a first thickness in a direction between the conductive gate and the substrate, a second portion including a second thickness in the direction between the conductive gate and the substrate, and a third portion including a third thickness in the direction between the conductive gate and the substrate. The first portion is between the second portion and the first semiconductor fin and the third portion is between the second portion and the second semiconductor fin. The first thickness is substantially equal to the third thickness, and each of the first portion and the third portion includes silicon nitride.

Formation of the second bottom spacer with first and third portions having substantially equal thicknesses provides the technical benefit of overcoming problems, for example, fin tapering, which can be associated with known spacer fabrication techniques such as deposition and recess fabrication processes.

In embodiments of the invention, the second thickness can be greater than the first thickness and the third thickness, which provides the technical advantage of increasing a distance separating portions of the conductive gate in regions not on one or more sidewalls of the semiconductor fins from a heavily doped region of the substrate. In this manner, a VFET device having reduced parasitic capacitance is provided.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of aspects of the present invention, one or more embodiments of the invention provide methods and structures configured to provide uniform bottom spacers in a VFET. Directional, e.g., lateral, semiconductor etching is used to form the bottom spacers of a VFET, which addresses the bottom spacer thickness variation issue related with the conventional methods as described above. More specifically, cavities are formed under sacrificial spacers of a VFET by directionally etching a portion of a heavily doped region of a substrate under the sacrificial spacer, and bottom spacers are formed in the cavities. Due to the precision allowed by the directional etching, a thickness (e.g., in a direction between the sacrificial spacer and the heavily doped region) of each of the cavities—and each of the bottom spacers formed in the cavities—can be uniform. Accordingly, the use of directional semiconductor etching to form bottom spacers, according to the present disclosure, provides better control over spacer uniformity, i.e., thickness, than known spacer fabrication techniques such as deposition and recess fabrication processes.

Methods for forming a semiconductor device and semiconductor devices in accordance with embodiments of the invention are described in detail below by referring to the accompanying drawings in FIGS. 1-14.

Figure 1:
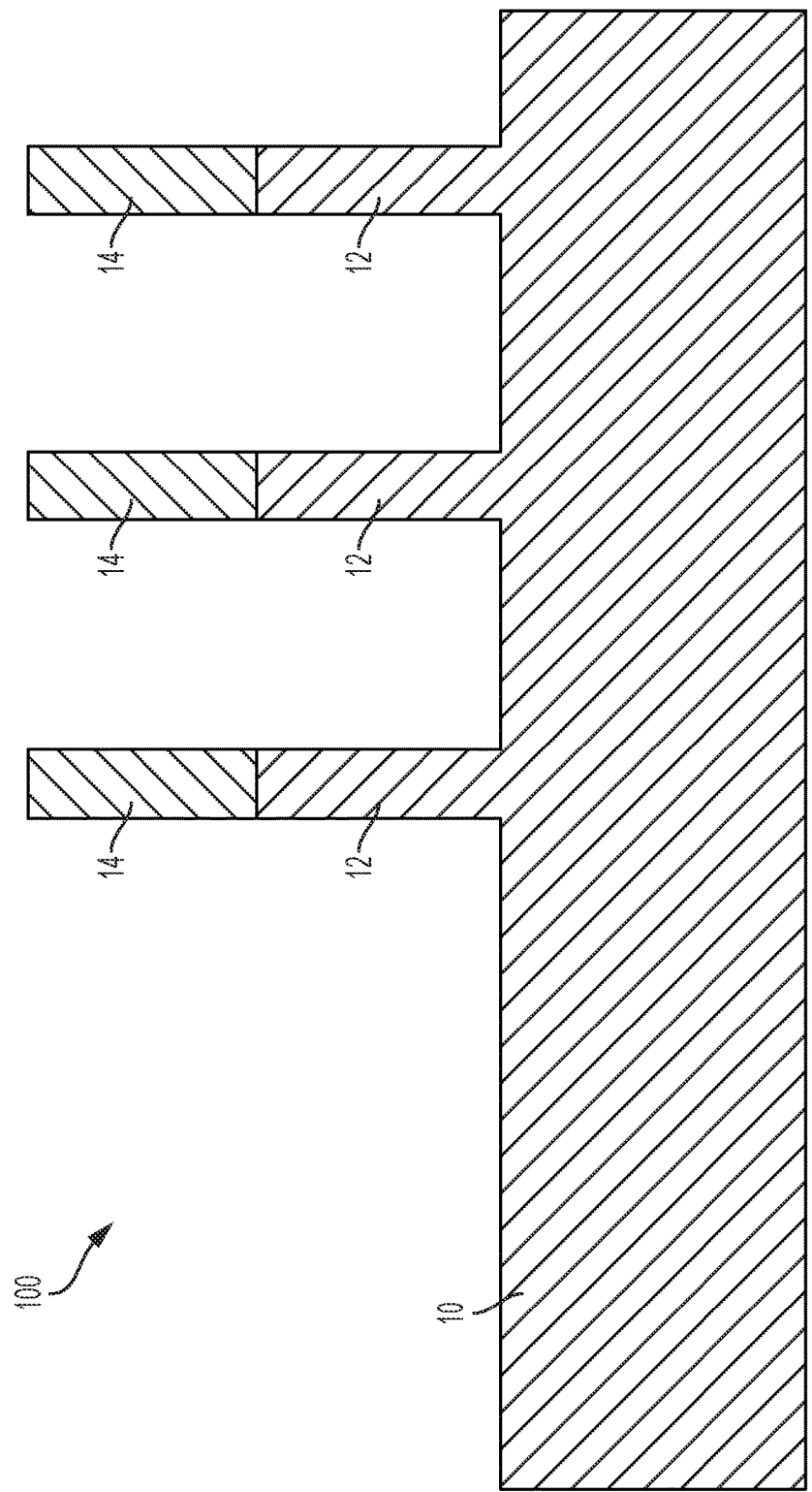
FIG. 1 depicts a cross-sectional view of a semiconductor structure after a fabrication operation according to one or more embodiments of the present invention.

With respect to embodiments of the invention depicted in FIGS. 1-7, FIG. 1 depicts a cross-sectional view of a VFET-based logic or static random-access memory (SRAM) device structure 100 formed on a substrate 100 during an intermediate operation of a method of fabricating a semiconductor device according to one or more embodiments of the invention. As depicted in FIG. 1, a partially fabricated semiconductor device can include one or more vertical semiconductor fins 12 (hereinafter semiconductor fins 12) formed on the substrate 10. Each of the semiconductor fins 12 can have a height ranging from 1 nm to 150 nm, for example, from 10 nm to 50 nm. Each of the semiconductor fins 12 can have a width ranging from 5 nm to 40 nm, for example, from 10 nm to 20 nm. Adjacent semiconductor fins 12 can be separated by a pitch ranging from 20 nm to 100 nm, for example, from 30 nm to 50 nm.

The substrate 10 can be any suitable substrate material, such as, for example, monocrystalline Si, SiGe, SiC, III-V compound semiconductor, II-VI compound semiconductor, or semiconductor-on-insulator (SOI). In embodiments of the invention, the substrate 10 includes a buried oxide layer (not depicted). The semiconductor fins 12 can be electrically isolated from other regions of the substrate 10 by a shallow trench isolation (not depicted). The shallow trench isolation (STI) can be of any suitable dielectric material, such as, for example, a silicon oxide. Any known manner of forming the STI can be utilized. In embodiments of the invention, the STI is formed by etching back the substrate 10 to form a trench, filling the trench with the STI material, and planarizing to a surface of the substrate 10 using, for example, a chemical-mechanical planarization (CMP) process.

A hard mask 14 is formed on a surface of each of the semiconductor fins 12. The hard mask 14 can include an oxide, nitride, oxynitride or any combination thereof, including multilayers. In embodiments of the invention, the hard mask 14 can include silicon oxide or silicon nitride. The hard mask 14 can be formed utilizing a deposition process such as, for example, chemical vapor deposition (CVD), plasma enhanced chemical vapor deposition (PECVD), chemical solution deposition, evaporation. In embodiments of the invention, the hard mask 14 can be formed by a thermal process such as, for example, oxidation or nitridation of the top semiconductor layer. Any combination of the above mentioned processes can also be used in forming the hard mask 14. The hard mask 14 can have a thickness from 20 nm to 80 nm, for example, from 30 nm to 60 nm.

In embodiments of the invention, the hard mask 14 is formed prior to the semiconductor fins 12. The hard mask 14 is then patterned and the pattern is transferred to the substrate 10 to form the semiconductor fins 12 using known lithographic processes. The lithographic step can include applying a photoresist layer (not depicted) atop the hard mask 14, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. The etching process can transfer the pattern from the patterned photoresist layer to the hard mask 14 and to the substrate 10. In embodiments of the invention, a buried insulator layer (not depicted) serves as an etch stop. After forming the semiconductor fins 12, the patterned photoresist layer can be removed utilizing a resist stripping process such as, for example, ashing.

In embodiments of the invention, the semiconductor fins 12 are formed utilizing a sidewall image transfer (SIT) process (not depicted). In an SIT process, spacers can be formed on a dummy mandrel. The dummy mandrel can be removed and the remaining spacers can be used as a hardmask to etch the top semiconductor layer. The spacers can then be removed after the semiconductor fins 12 have been formed.

Figure 2:
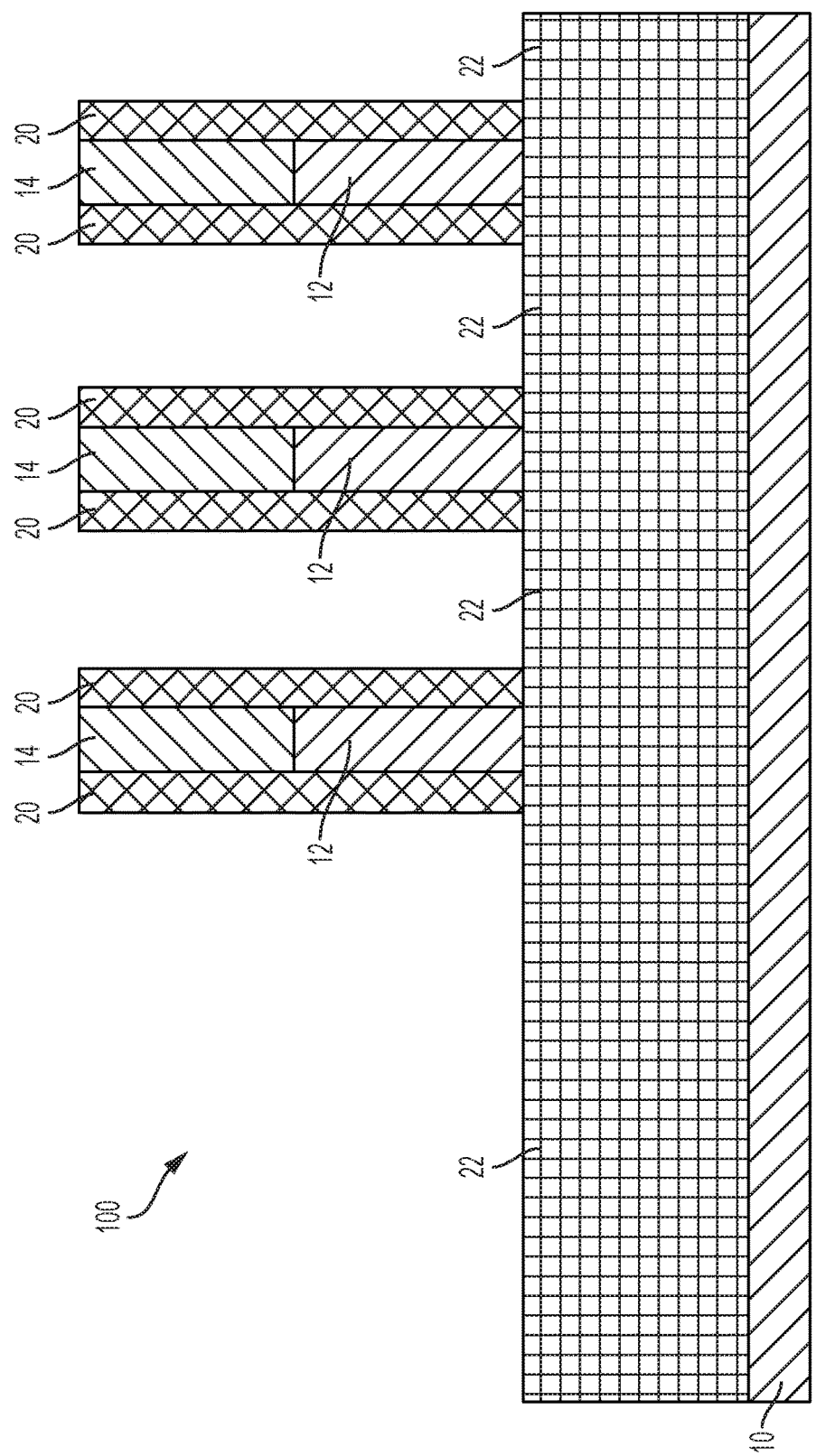
FIG. 2 depicts a cross-sectional view of the semiconductor structure after a fabrication operation according to one or more embodiments of the present invention.

FIG. 2 depicts a cross-sectional view of the structure 100 after heavily doped region 22 formation and sacrificial spacer 20 deposition during an intermediate operation of the exemplary method of fabricating a semiconductor device according to one or more embodiments of the invention. As depicted in FIG. 2, a heavily doped region 22 is formed. The heavily doped region 22 can be a source or drain region formed in the substrate 10 by a variety of methods, such as, for example, in-situ doped epitaxy, doped following the epitaxy, or by implantation and plasma doping. The heavily doped region 22 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and molecular-beam epitaxy (MBE). In embodiments of the invention, the heavily doped region 22 includes epitaxial semiconductor materials grown from gaseous or liquid precursors. In embodiments of the invention, epitaxial regions are epitaxially grown over the substrate 10. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In embodiments of the invention, the doped regions include silicon. In embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

As further depicted in FIG. 2, sacrificial spacers 20 are deposited on sidewalls of the semiconductor fins 12 and on top of heavily doped region 22. In embodiments of the invention, the sacrificial spacers 20 are formed by deposition of a spacer material layer and subsequently etching the spacer material layer using, for example, RIE.

The sacrificial spacers 20 can be a dielectric material, such as silicon oxide, silicon nitride, silicon oxynitride, a low-k material, or a combination thereof. The low-k material can be a dielectric material having a dielectric constant less than about 7, for example, less than about 5 or even less than about 2.5, such as, for example, carbon containing silicon materials such as silicon oxycarbides (SiOC) or silicon carbides, silicon nitrides (SiN), or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

Figure 3:
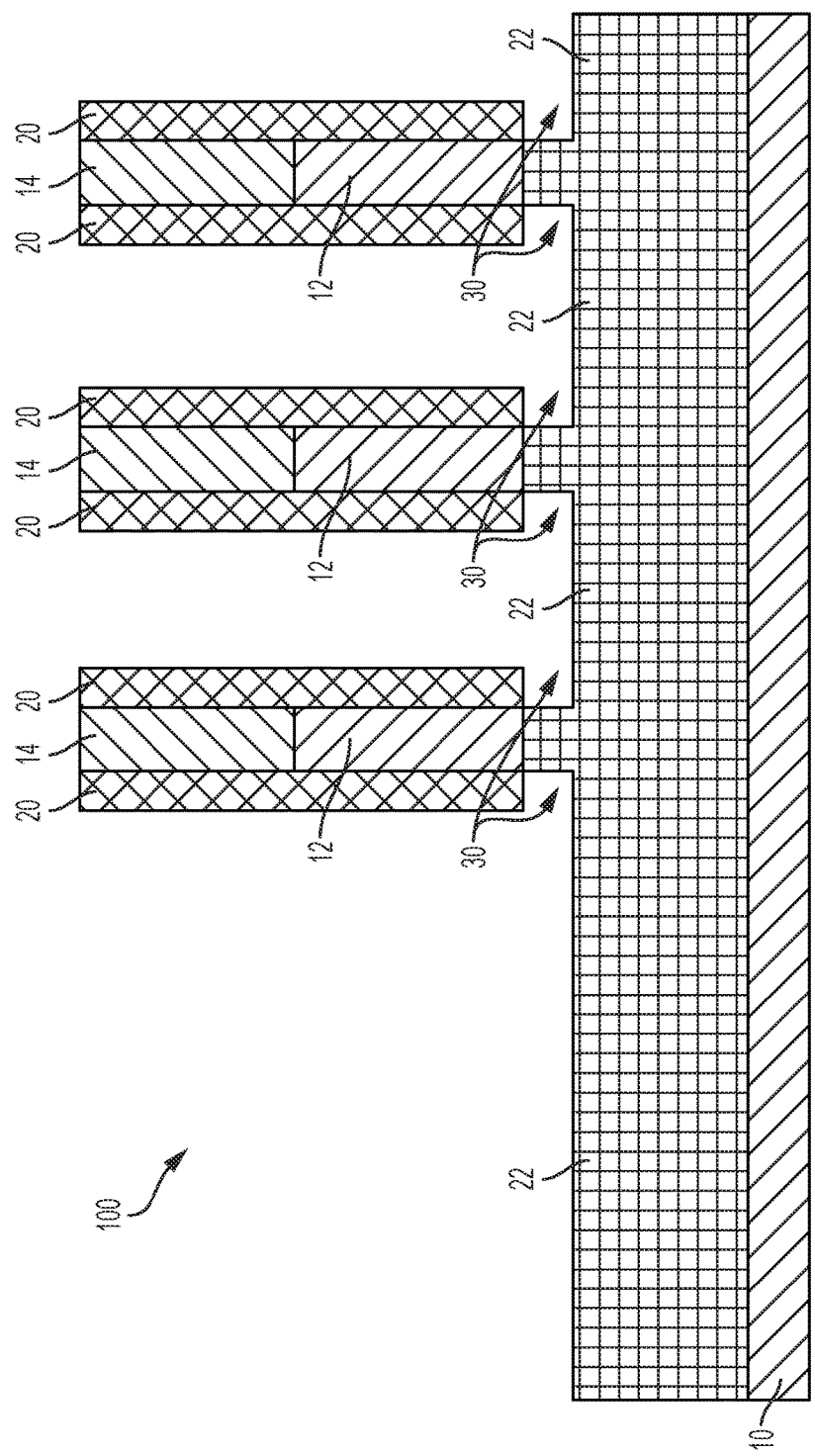
FIG. 3 depicts a cross-sectional view of the semiconductor structure after a fabrication operation according to one or more embodiments of the present invention.

FIG. 3 depicts a cross-sectional view of the structure 100 after recessing surfaces of the heavily doped region 22 during an intermediate operation of a method of fabricating a semiconductor device according to one or more embodiments of the invention. The top surface of the heavily doped region 22 can be recessed using, for example, a wet etch, a dry etch, or a combination thereof. In embodiments of the invention, the top surface of the heavily doped region 22 is recessed selective to the sacrificial spacers 20.

As further depicted in FIG. 3, portions of the heavily doped region 22, for example, portions of the heavily doped region 22 under the sacrificial spacers 20, are laterally recessed using known processes, such as, for example, a directional ME. The lateral etching can form a cavities 30 under the sacrificial spacers 20. The lateral recessing can use, for example, a wet etch, a dry etch, or a combination thereof. In particular, a directional semiconductor etching, for example, dry etching, of the heavily doped region 22 can be followed by isotropic etching, for example, wet etching. Due to the precision allowed by the directional etching of the heavily doped region 22, a thickness (e.g., in a direction between the sacrificial spacer 20 and the heavily doped region 22) of each of the cavities 30 can be the same or substantially the same.

In embodiments of the invention, portions of the heavily doped region 22 are laterally etched selective to the sacrificial spacers 20. The surfaces of the heavily doped region 22 that are laterally recessed can be substantially parallel to the top surface of the heavily doped region 22. As depicted in FIG. 3, in embodiments of the invention, the heavily doped region 22 can be laterally recessed such that portions remaining under the semiconductor fins 12 and the sacrificial spacers 20 after the lateral etching have a same or substantially same width as the semiconductor fins 12.

Figure 4:
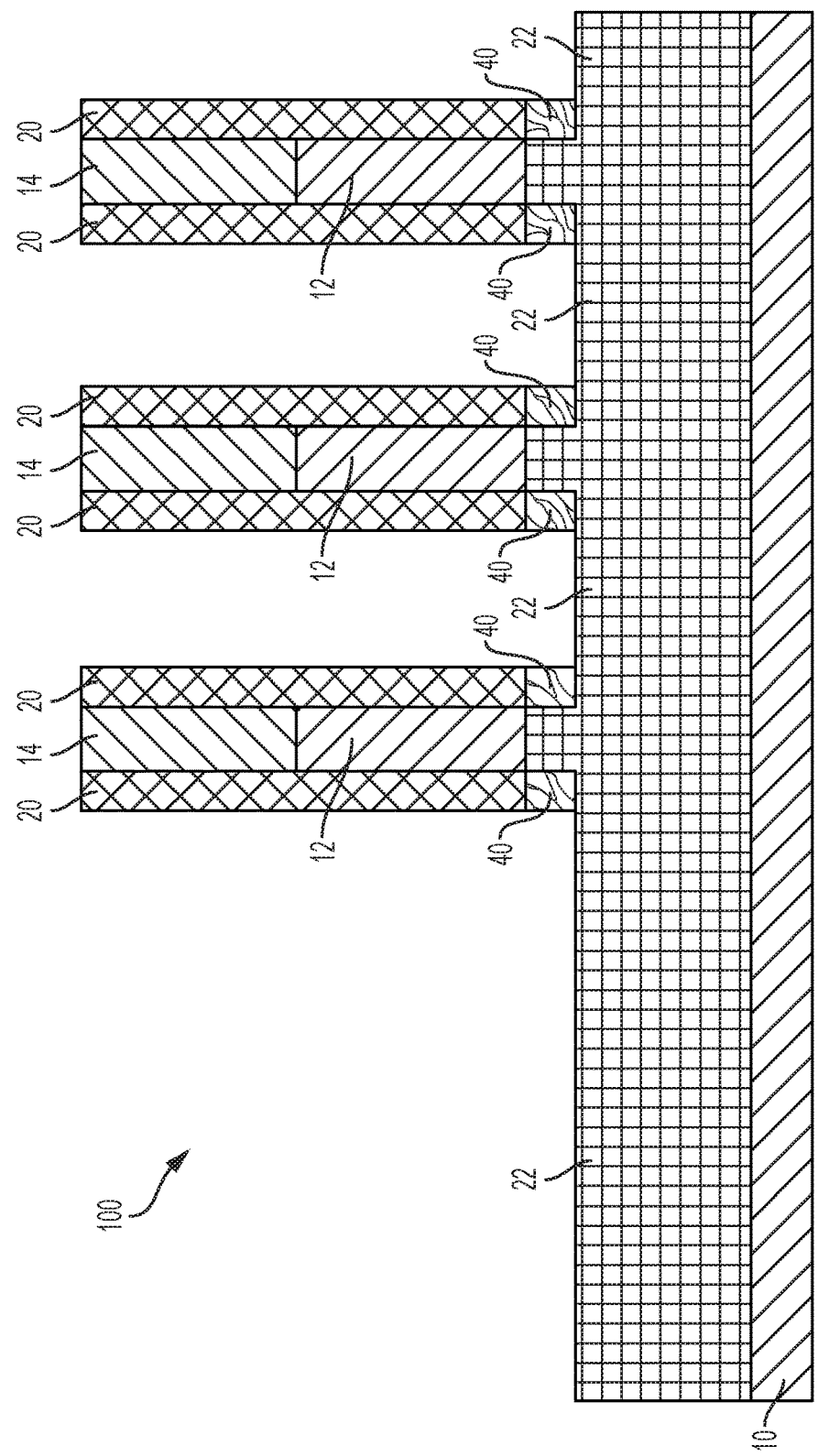
FIG. 4 depicts a cross-sectional view of the semiconductor structure after a fabrication operation according to one or more embodiments of the present invention.

FIG. 4 depicts a cross-sectional view of the structure 100 after first bottom spacer 40 formation during an intermediate operation of the exemplary method of fabricating a semiconductor device according to one or more embodiments of the invention. The first bottom spacers 40 are formed between the heavily doped region 22 and the sacrificial spacers 20, for example, in the cavities (depicted in FIG. 3). The first bottom spacers 40 can include a dielectric material, such as silicon oxide, silicon nitride, silicon oxynitride, or a combination thereof, and can be formed using known deposition processes. The sacrificial spacers 20 can be formed of a spacer material whose etching is selective to the first bottom spacers 40. In embodiments of the invention, the first bottom spacers 40 include silicon nitride, and is formed by atomic layer deposition (ALD) followed by isotropic nitride etch back.

A width (e.g., in a direction orthogonal to a direction between the sacrificial spacer 20 and the heavily doped region 22) of each of the first bottom spacers 40 can be equal to or substantially equal to a width of each of the sacrificial spacers 20. Further, as a thickness (e.g., in a direction between the sacrificial spacer 20 and the heavily doped region 22) of each of the cavities (depicted in FIG. 3) can be the same or substantially the same, the thickness (e.g., in the direction between the sacrificial spacer 20 and the heavily doped region 22) of each of the first bottom spacers 40 formed in the cavities (depicted in FIG. 3) can be the same or substantially the same.

Figure 5:
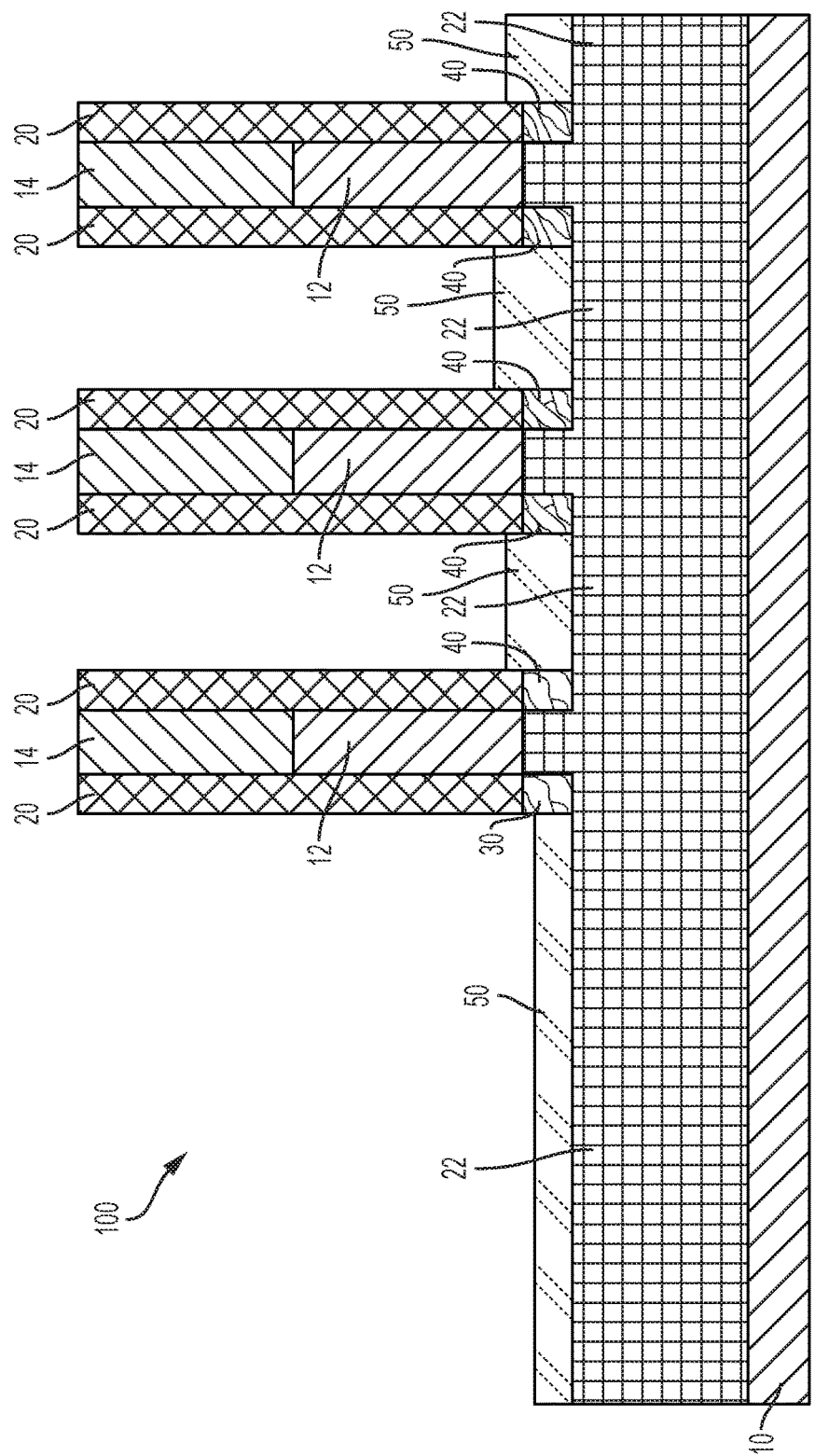
FIG. 5 depicts a cross-sectional view of the semiconductor structure after a fabrication operation according to one or more embodiments of the present invention.

FIG. 5 depicts a cross-sectional view of the structure 100 after second bottom spacer 50 formation during an intermediate operation of the exemplary method of fabricating a semiconductor device according to one or more embodiments of the invention. The second bottom spacers 50 can be formed on exposed, e.g., upper, surfaces of the substrate 10 that are not covered by the sacrificial spacers 20. The second bottom spacers 50 can include a dielectric material, such as silicon oxide, silicon nitride, silicon oxynitride, or a combination thereof. In embodiments of the invention, the second bottom spacers 50 can include a same material as the first bottom spacers 40.

In embodiments of the invention, the second bottom spacers 50 are formed by performing a directional deposition process such as, for example, a GCIB or HDP process. The HDP process includes cycles of deposition and etching, for example, deposition followed by etching followed by deposition followed by etching. The HDP and GCIB processes are deposition processes that can be highly directional in nature. For example, the directional deposition process can result in the deposition of dielectric material on the horizontally oriented surfaces of the device, such as the upper surface of the substrate 10, while avoiding deposition of any substantial amount of dielectric material on the vertically-oriented surfaces of the device, such as sidewalls of the sacrificial spacers 20.

Figure 6:
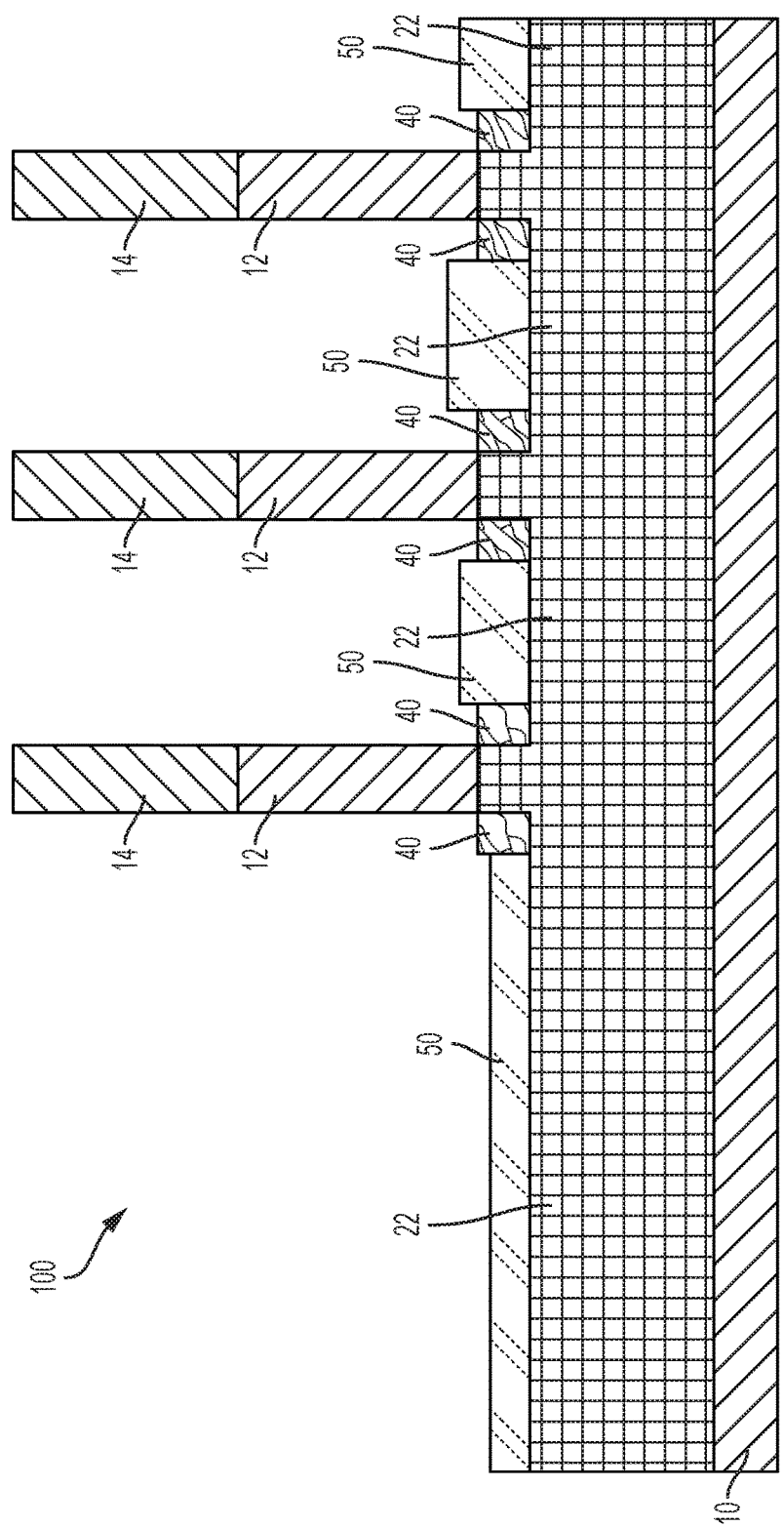
FIG. 6 depicts a cross-sectional view of the semiconductor structure after a fabrication operation according to one or more embodiments of the present invention.

FIG. 6 depicts a cross-sectional view of the structure 100 after sacrificial spacer removal during an intermediate operation of the exemplary method of fabricating a semiconductor device according to one or more embodiments of the invention. As depicted in FIG. 6, the sacrificial spacers 20 are removed. The sacrificial spacers 20 can be removed using, for example, a wet etch, a dry etch, or a combination of sequential wet and/or dry etches. Examples of dry etching processes that can be used include ME, ion beam etching, plasma etching or laser ablation. In embodiments of the invention, the sacrificial spacers 20 are selective to the second bottom spacers 50.

Figure 7:
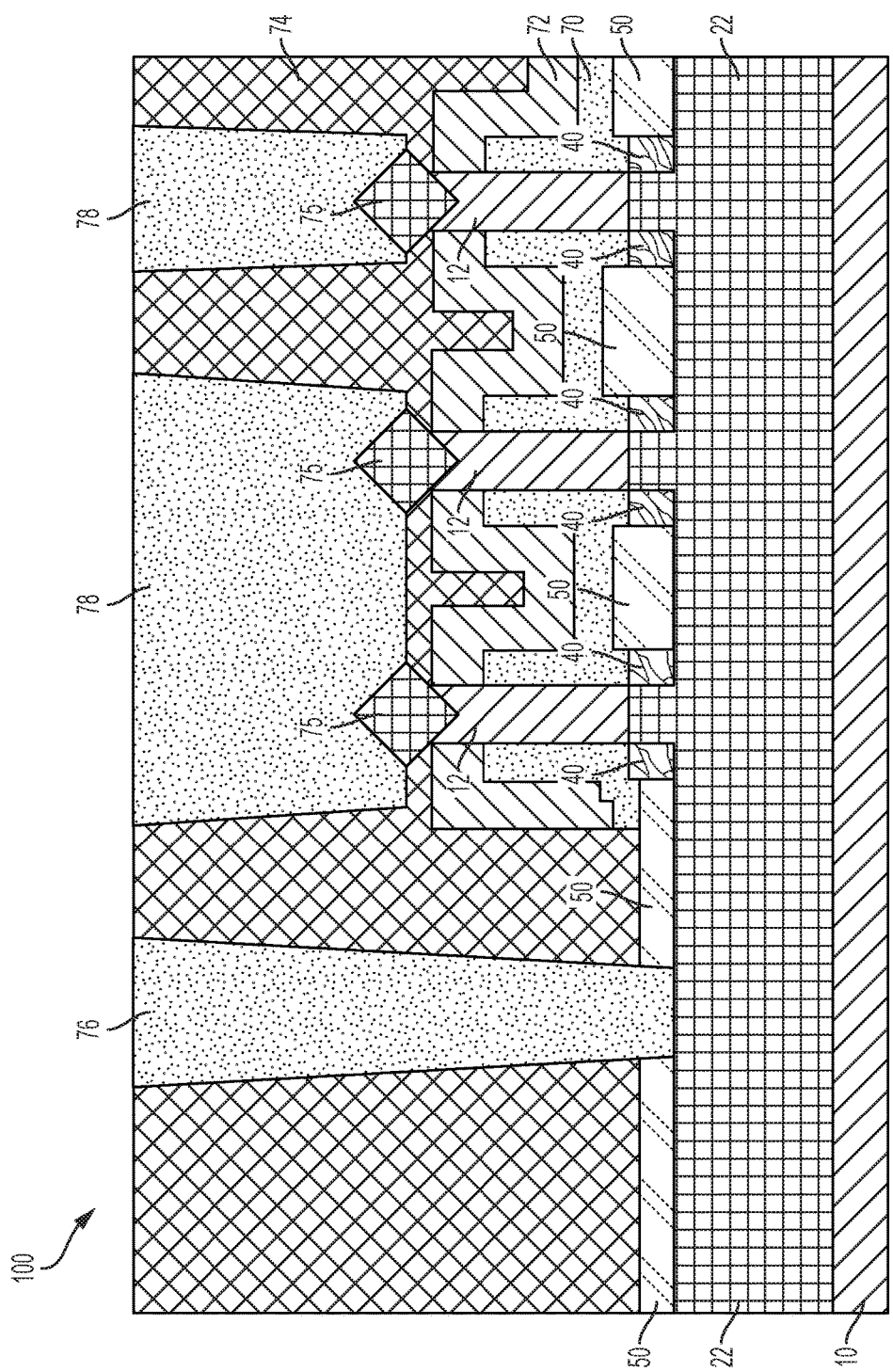
FIG. 7 depicts a cross-sectional view of a semiconductor structure after a fabrication operation according to one or more embodiments of the present invention.

FIG. 7 depicts a cross-sectional view of the structure 100 after subsequent operations of the exemplary method of fabricating a semiconductor device according to one or more embodiments of the invention. FIG. 7 shows the structure 100 in final form, e.g., after all operations of the exemplary method of fabricating a semiconductor device according to one or more embodiments of the invention. As depicted in FIG. 7, a high dielectric constant conductive gate 70 (hereinafter conductive gate 70) can be formed by, for example, deposition, over channel regions (i.e., sidewalls) of the semiconductor fins 12, the first bottom spacers 40, and the second bottom spacers 50. In embodiments of the invention, the deposition of the conductive gate 70 forms a seam due to a pinch-off effect in the channel region of the semiconductor fins 12. In embodiments of the invention, portions of the conductive gate 70 in non-channel regions of the structure 100 are recessed via, e.g., chamfering, to help reduce gate resistance.

The conductive gate 70 can be made of any suitable gate material, such as, for example, a high dielectric constant material having a dielectric constant greater than silicon dioxide. Exemplary high dielectric constant material include, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof, where each value of x is independently from 0.5 to 3 and each value of y is independently from 0 to 2.

A top spacer 72 can be formed over the conductive gate 70. The top spacer 72 can include a dielectric material, such as silicon oxide, silicon nitride, silicon oxynitride, or a combination thereof, and can be formed using a deposition process such as, for example, GCIB, in a similar manner as the second bottom spacers 50. In embodiments of the invention, the top spacer 72 can include a same material as the first bottom spacers 40 and/or the second bottom spacers 50.

An interlayer dielectric (ILD) 74 can be deposited over the structure 100, for example, to fill regions between the semiconductor fins 12. The ILD 74 can be any suitable dielectric material, such as, for example, a silicon oxide.

The ILD 74 can be polished using, for example, CMP selective to the top spacer 72. The CMP process can be utilized to remove excess portions of ILD 74 such that the upper surface of ILD 74 is coplanar with the upper surface of the top spacer 72. In embodiments of the invention, the material of ILD 74 is chosen such that portion of the top spacer 72 and the hard mask 14 can be removed selective to the ILD 74 during a subsequent etching.

A portion of the top spacer 72 and the hard mask 14 is removed to expose portions of the semiconductor fins 12. Top source/drain (S/D) regions 75 are then formed on the exposed portions of the semiconductor fins 12.

The top S/D regions 75 can be an epitaxial silicon layer epitaxially grown using known processes. As described above, epitaxial materials can be grown from gaseous or liquid precursors. Epitaxial materials can be grown using, for example, VPE, MBE, or LPE. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the top S/D regions 75 can range from about $1 \times 10^{19}$ $cm^{-3}$ to about $2 \times 10^{21}$ $cm^{-3}$, for example, between about $2 \times 10^{20}$ $cm^{-3}$ to about $1 \times 10^{21}$ $cm^{-3}$. In embodiments of the invention, the gas source for the deposition of epitaxial semiconductor materials can include a silicon containing gas source, a germanium containing gas source, or a combination thereof.

A conductive contact 76 is formed in ohmic contact with electrically-active areas of the substrate 10. The conductive contact 76 can be formed using known metallization techniques. For example, in embodiments of the invention, the ILD 74 is extended and then patterned with open trenches. The conductive contact 76 is then deposited into the trenches. In embodiments of the invention, the conductive contact 76 is overfilled into the trenches, forming overburdens above a surface of the ILD 74. In embodiments of the invention, a CMP selective to the ILD 74 removes the overburden.

The conductive contact 76 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In embodiments of the invention, the conductive contact 76 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Local interconnect lines 78, 79 in ohmic contact with the top S/D regions 75 are also formed. The local interconnect lines 78, 79 can be formed using known metallization techniques, and can be made of a similar material as the conductive contact 76. As depicted in FIG. 7, local interconnect line 78 is formed in ohmic contact with two adjacent top S/D regions 75 and adjacent local interconnect line 79 is formed in ohmic contact with one top S/D region 75. In embodiments of the invention, the local interconnect lines 78, 79 can be merged together.

As depicted in FIG. 7, the second bottom spacers 50 can have a thickness that is greater than a thickness of the first bottom spacers 40. The greater thickness of the second bottom spacers 50 as compared to the first bottom spacers 40 can result in a stepped bottom spacer, e.g., the combination of a first bottom spacer 40 and a second bottom spacer 50. The stepped bottom spacer can increase a distance separating portions of the conductive gate 70 in non-channel regions, e.g., regions not on one or more sidewalls of the semiconductor fins 12, from the heavily doped region 22, which can serve as a bottom S/D region, and a parasitic capacitance of the structure 100 can be decreased.

In embodiments of the invention, the second bottom spacers 50 can have a thickness that is less than (not depicted) a thickness of the first bottom spacers 40. In embodiments of the invention, the second bottom spacers 50 can have varying thickness, for example, varying thicknesses greater than the second bottom spacers 50, or some of the second bottom spacers 50 can have a thickness less than a thickness of the first bottom spacers 40, while others of the second bottom spacers 50 can have a thickness greater than a thickness of the first bottom spacers 40.

Thus it can be seen that technical effects and benefits can be provided to a VFET-based logic or SRAM device. In particular, such devices can be formed to include VFETs having uniform bottom spacers.

Figure 8:
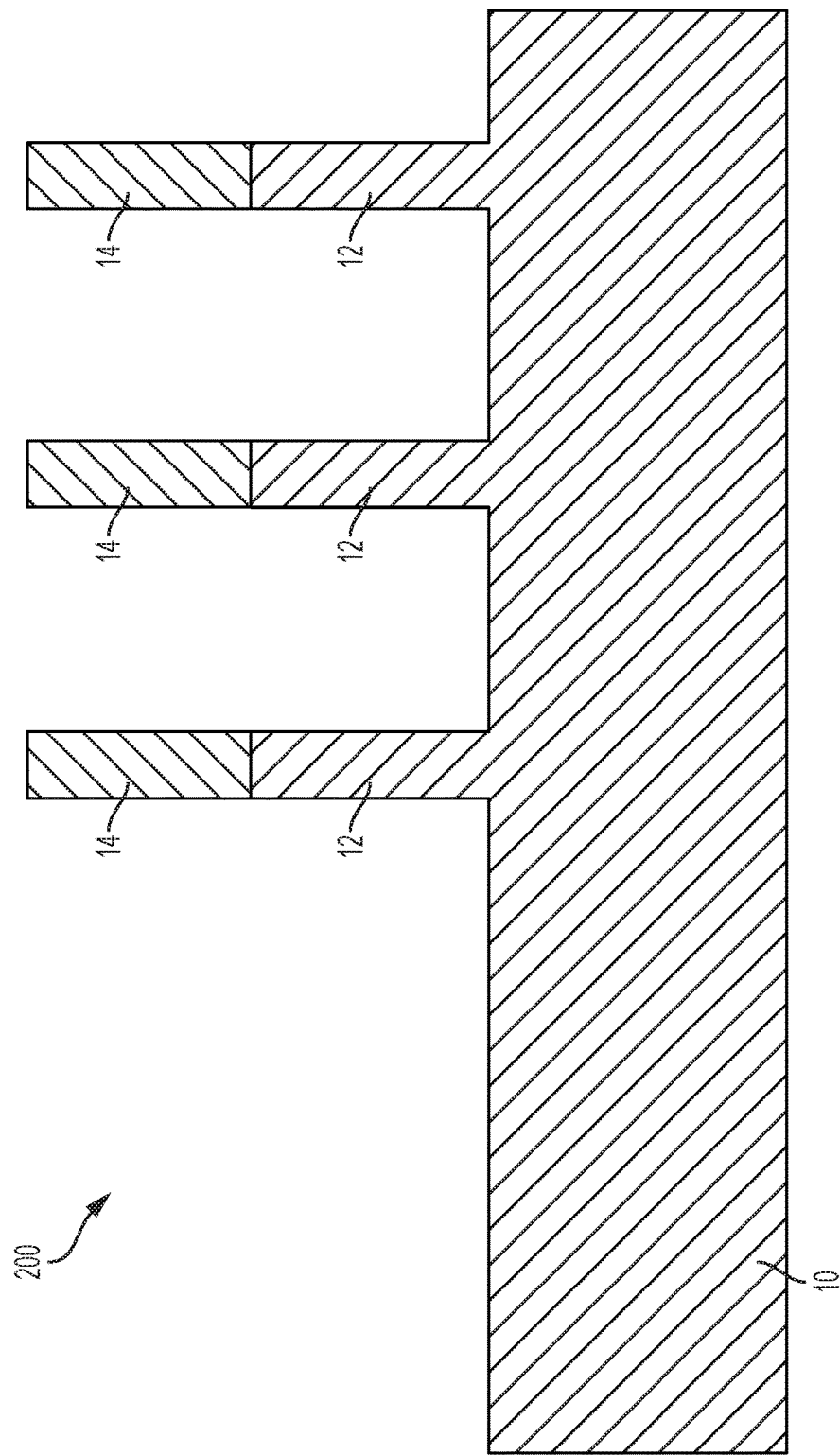
FIG. 8 depicts a cross-sectional view of a semiconductor structure after a fabrication operation according to one or more embodiments of the present invention.

With respect to embodiments of the invention depicted in FIGS. 8-14, FIG. 8 depicts a cross-sectional view of a VFET-based logic or SRAM device structure 200 formed on a substrate 100 during an intermediate operation of a method of fabricating a semiconductor device according to one or more embodiments of the invention. As depicted in FIG. 8, a partially fabricated semiconductor device can include one or more semiconductor fins 12 formed on the substrate 10. Each of the semiconductor fins 12 can have a height ranging from 1 nm to 150 nm, for example, from 10 nm to 50 nm. Each of the semiconductor fins 12 can have a width ranging from 5 nm to 40 nm, for example, from 10 nm to 20 nm. Adjacent semiconductor fins 12 can be separated by a pitch ranging from 20 nm to 100 nm, for example, from 30 nm to 50 nm.

The substrate 10 can be any suitable substrate material, such as, for example, monocrystalline Si, SiGe, SiC, III-V compound semiconductor, II-VI compound semiconductor, or SOI. In embodiments of the invention, the substrate 10 includes a buried oxide layer (not depicted). The semiconductor fins 12 can be electrically isolated from other regions of the substrate 10 by a shallow trench isolation (not depicted). The STI can be of any suitable dielectric material, such as, for example, a silicon oxide. Any known manner of forming the STI can be utilized. In embodiments of the invention, the STI is formed by etching back the substrate 10 to form a trench, filling the trench with the STI material, and planarizing to a surface of the substrate 10 using, for example, a CMP process. A hard mask 14 is formed on a surface of each of the semiconductor fins 12, described above.

Figure 9:
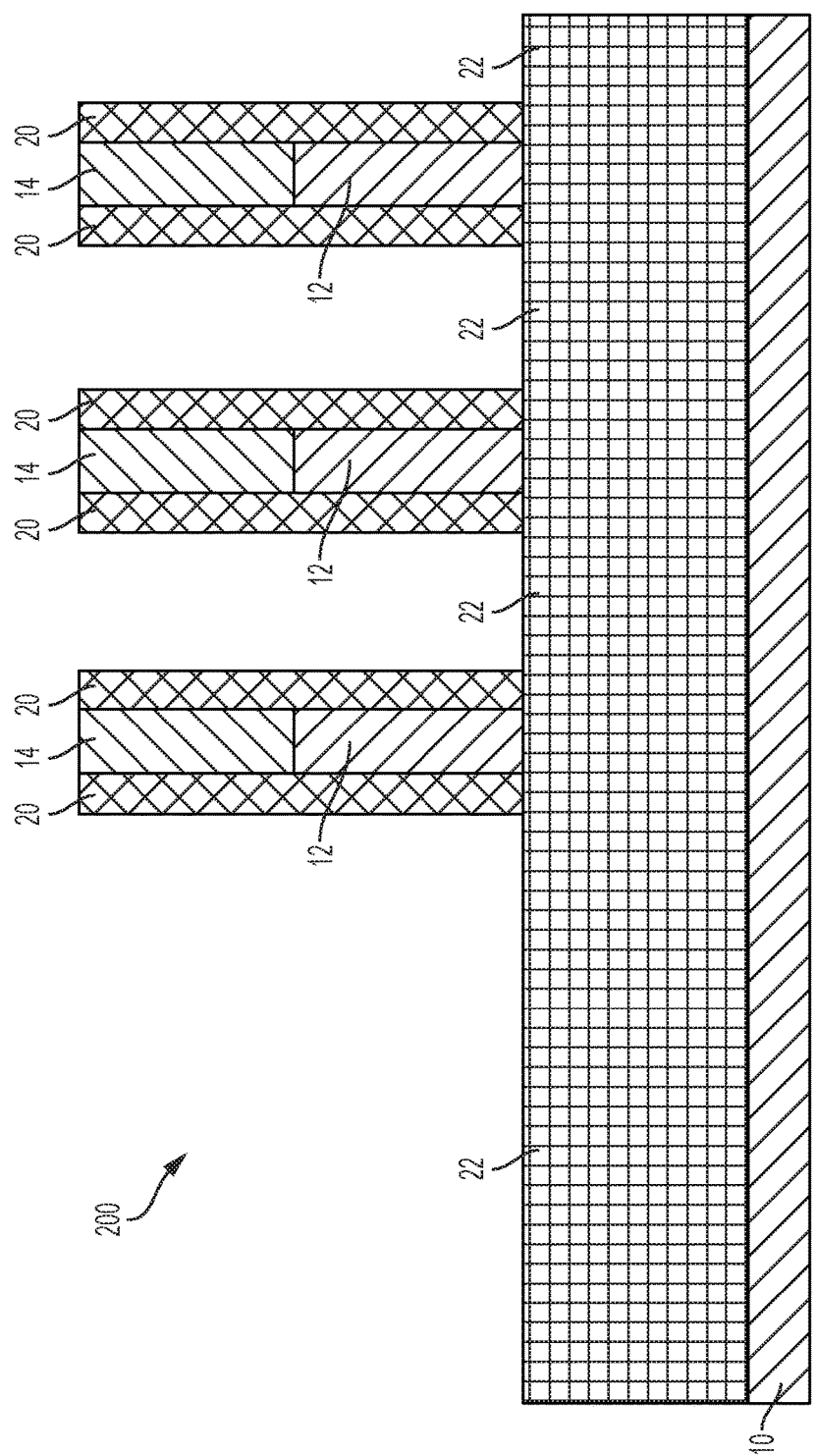
FIG. 9 depicts a cross-sectional view of the semiconductor structure after a fabrication operation according to one or more embodiments of the present invention.

FIG. 9 depicts a cross-sectional view of the structure 200 after heavily doped region 22 formation and sacrificial spacer 20 deposition during an intermediate operation of the exemplary method of fabricating a semiconductor device according to one or more embodiments of the invention. As depicted in FIG. 9, a heavily doped region 22 is formed. The heavily doped region 22 can be a source or drain region formed in the substrate 10 by a variety of methods, as described above.

As further depicted in FIG. 9, sacrificial spacers 20 are deposited on sidewalls of the semiconductor fins 12 and on top of heavily doped region 22. In embodiments of the invention, the sacrificial spacers 20 are formed by deposition of a spacer material layer and subsequently etching the spacer material layer using, for example, ME. The sacrificial spacers 20 can be a dielectric material, such as silicon oxide, silicon nitride, silicon oxynitride, a low-k material, or a combination thereof, as described above.

Figure 10:
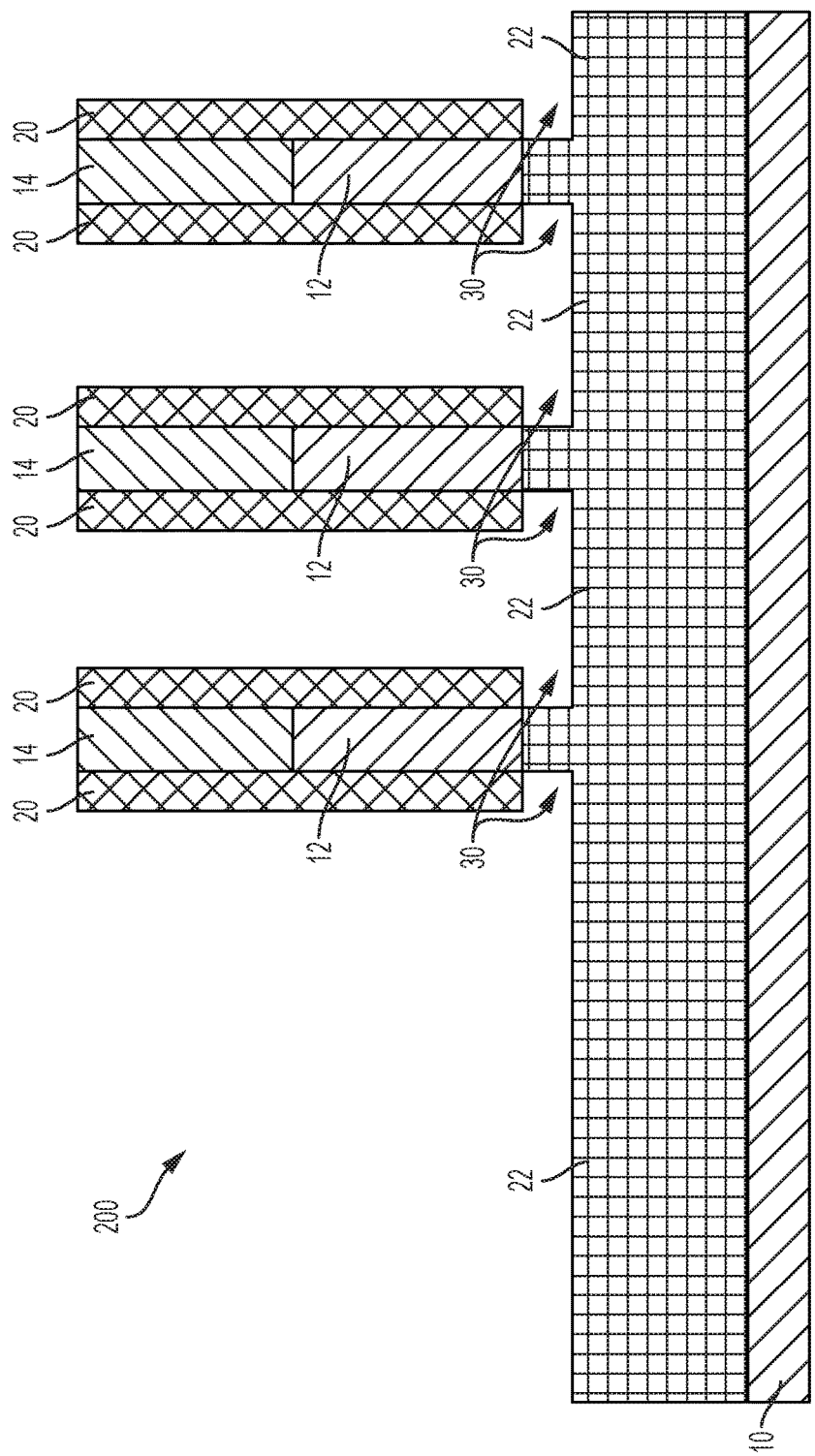
FIG. 10 depicts a cross-sectional view of the semiconductor structure after a fabrication operation according to one or more embodiments of the present invention.

FIG. 10 depicts a cross-sectional view of the structure 200 after recessing surfaces of the heavily doped region 22 during an intermediate operation of a method of fabricating a semiconductor device according to one or more embodiments of the invention. The top surface of the heavily doped region 22 can be recessed using, for example, a wet etch, a dry etch, or a combination thereof. In embodiments of the invention, the top surface of the heavily doped region 22 is recessed selective to the sacrificial spacers 20.

As further depicted in FIG. 10, portions of the heavily doped region 22, for example, portions of the heavily doped region 22 under the sacrificial spacers 20, are laterally recessed using known processes, such as, for example, a directional RIE. The lateral etching can form a cavities 30 under the sacrificial spacers 20. The lateral recessing can use, for example, a wet etch, a dry etch, or a combination thereof. In particular, a directional semiconductor etching, for example, dry etching, of the heavily doped region 22 can be followed by isotropic etching, for example, wet etching. Due to precision allowed by the directional etching of the heavily doped region 22, a thickness (e.g., in a direction between the sacrificial spacer 20 and the heavily doped region 22) of each of the cavities 30 can be the same or substantially the same.

In embodiments of the invention, portions of the heavily doped region 22 are laterally etched selective to the sacrificial spacers 20. The surfaces of the heavily doped region 22 that are laterally recessed can be substantially parallel to the top surface of the heavily doped region 22. As depicted in FIG. 10, in embodiments of the invention, the heavily doped region 22 can be laterally recessed such that portions remaining under the semiconductor fins 12 and the sacrificial spacers 20 after the lateral etching have a greater width than the semiconductor fins 12. Comparing FIGS. 3 and 10, a width of the portions remaining under the semiconductor fins 12 and the sacrificial spacers 20 after the lateral etching can be controlled, for example, by selection of etching methods, for example, dry etching versus wet etching, combinations and order of various etching methods, and/or an amount of time that any given etching method is used.

Figure 11:
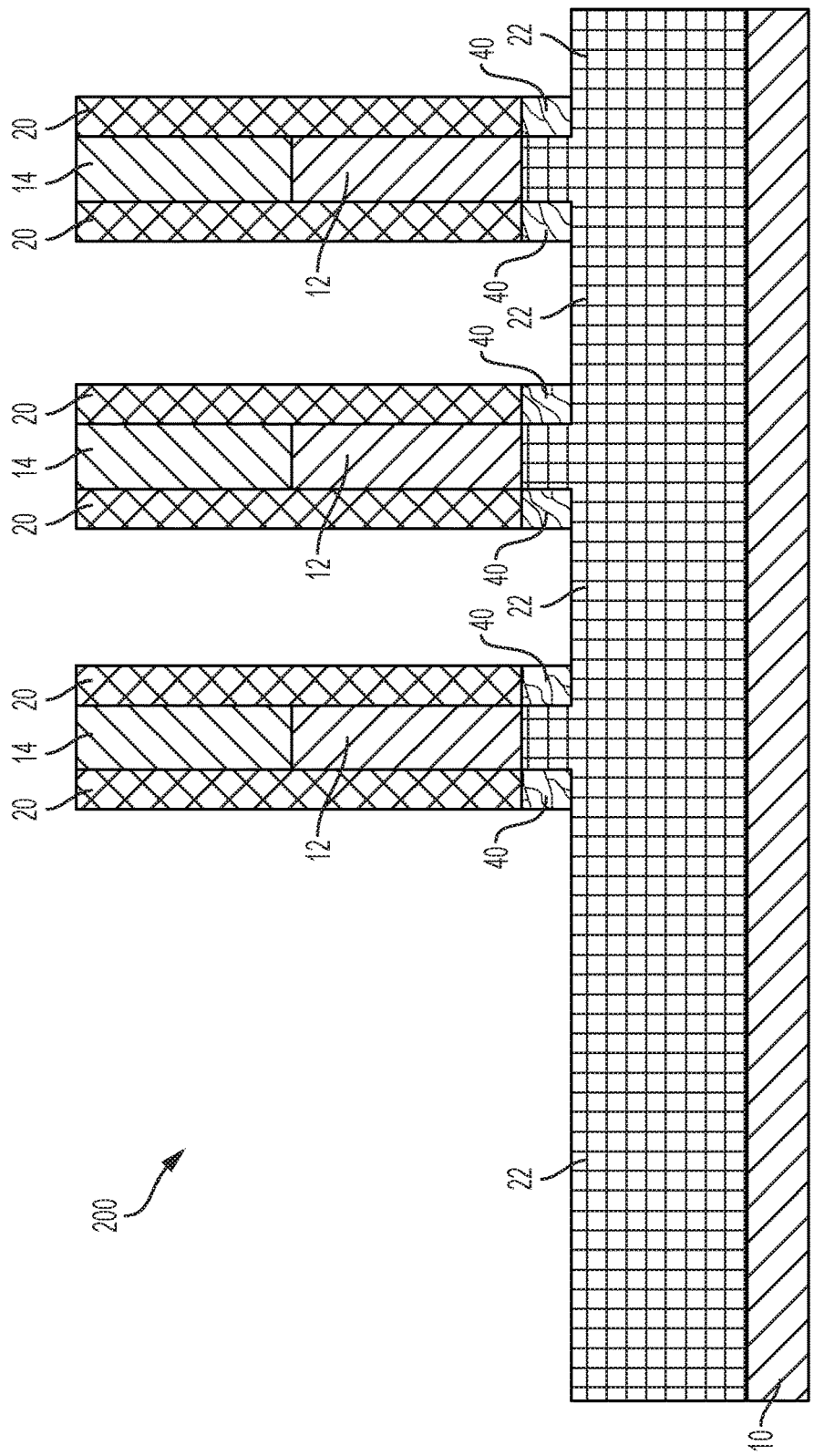
FIG. 11 depicts a cross-sectional view of the semiconductor structure after a fabrication operation according to one or more embodiments of the present invention.

FIG. 11 depicts a cross-sectional view of the structure 200 after first bottom spacer 40 formation during an intermediate operation of the exemplary method of fabricating a semiconductor device according to one or more embodiments of the invention. The first bottom spacers 40 are formed between the heavily doped region 22 and the sacrificial spacers 20, for example, in the cavities (depicted in FIG. 10). The first bottom spacers 40 can include a dielectric material, such as silicon oxide, silicon nitride, silicon oxynitride, or a combination thereof, and can be formed using known deposition processes. The sacrificial spacers 20 can be formed of a spacer material whose etching is selective to the first bottom spacers 40. In embodiments of the invention, the first bottom spacers 40 include silicon nitride, and is formed by ALD followed by isotropic nitride etch back.

A width (e.g., in a direction orthogonal to a direction between the sacrificial spacer 20 and the heavily doped region 22) of each of the first bottom spacers 40 can be less than a width of each of the sacrificial spacers 20. Further, as a thickness (e.g., in a direction between the sacrificial spacer 20 and the heavily doped region 22) of each of the cavities (depicted in FIG. 10) can be the same or substantially the same, the thickness (e.g., in the direction between the sacrificial spacer 20 and the heavily doped region 22) of each of the first bottom spacers 40 formed in the cavities (depicted in FIG. 10) can be the same or substantially the same.

Figure 12:
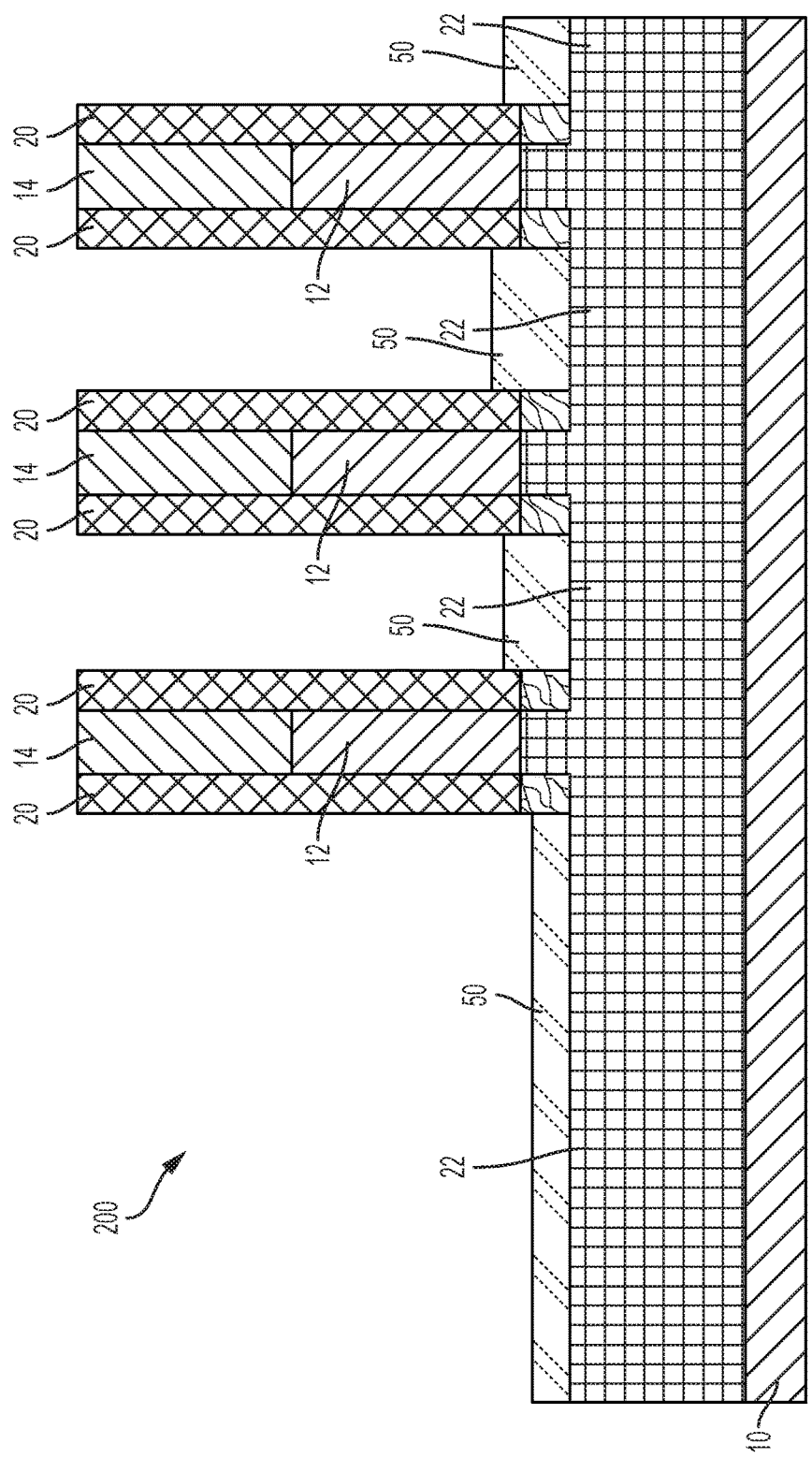
FIG. 12 depicts a cross-sectional view of the semiconductor structure after a fabrication operation according to one or more embodiments of the present invention.

FIG. 12 depicts a cross-sectional view of the structure 200 after second bottom spacer 50 formation during an intermediate operation of the exemplary method of fabricating a semiconductor device according to one or more embodiments of the invention. The second bottom spacers 50 can be formed on exposed, e.g., upper, surfaces of the substrate 10 that are not covered by the sacrificial spacers 20. The second bottom spacers 50 can include a dielectric material, such as silicon oxide, silicon nitride, silicon oxynitride, or a combination thereof. In embodiments of the invention, the second bottom spacers 50 can include a same material as the first bottom spacers 40. In embodiments of the invention, the second bottom spacers 50 are formed by performing a directional deposition process such as, for example, a GCIB or HDP process, as described above.

Figure 13:
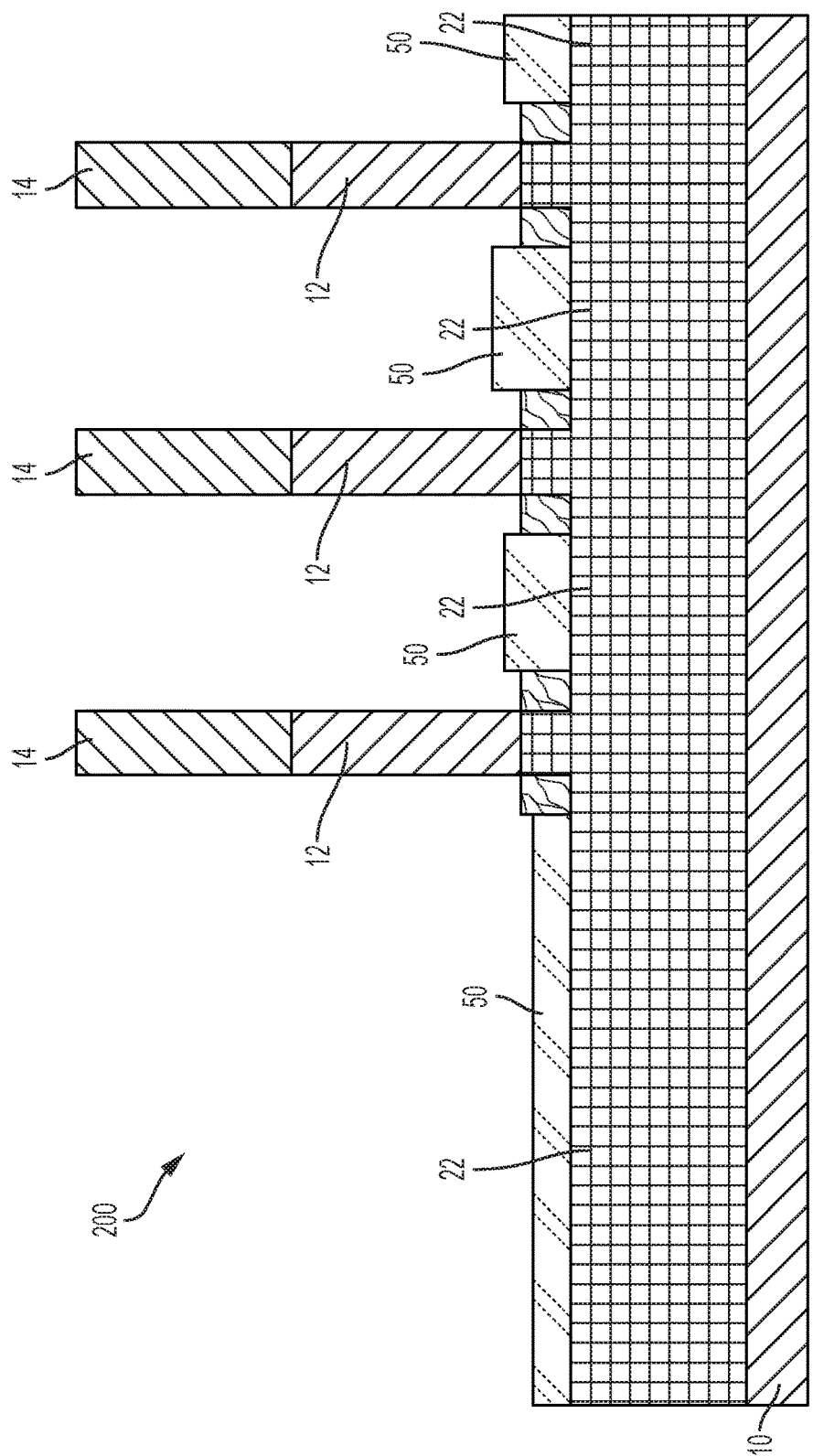
FIG. 13 depicts a cross-sectional view of the semiconductor structure after a fabrication operation according to one or more embodiments of the present invention.

FIG. 13 depicts a cross-sectional view of the structure 200 after sacrificial spacer removal during an intermediate operation of the exemplary method of fabricating a semiconductor device according to one or more embodiments of the invention. As depicted in FIG. 13, the sacrificial spacers 20 are removed. The sacrificial spacers 20 can be removed using, for example, a wet etch, a dry etch, or a combination of sequential wet and/or dry etches. Examples of dry etching processes that can be used include ME, ion beam etching, plasma etching or laser ablation. In embodiments of the invention, the sacrificial spacers 20 are selective to the second bottom spacers 50.

Figure 14:
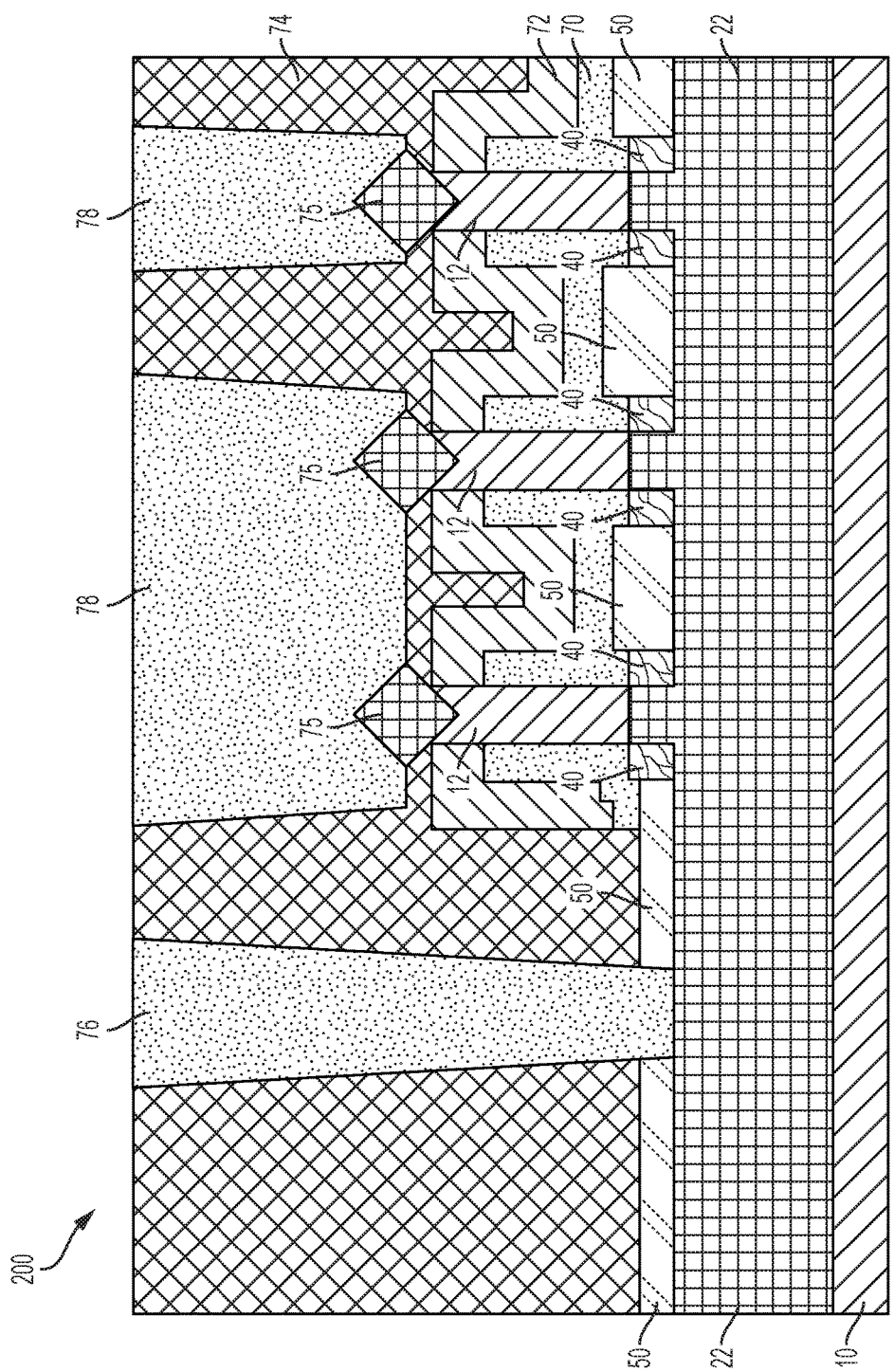
FIG. 14 depicts a cross-sectional view of the semiconductor structure after a fabrication operation according to one or more embodiments of the present invention.

FIG. 14 depicts a cross-sectional view of the structure 200 after subsequent operations of the exemplary method of fabricating a semiconductor device according to one or more embodiments of the invention. FIG. 14 shows the structure 200 in final form, e.g., after all operations of the exemplary method of fabricating a semiconductor device according to one or more embodiments of the invention. As depicted in FIG. 14, a conductive gate 70 can be formed by, for example, deposition, over channel regions (i.e., sidewalls) of the semiconductor fins 12, the first bottom spacers 40, and the second bottom spacers 50. In embodiments of the invention, the deposition of the conductive gate 70 forms a seam due to a pinch-off effect in the channel region of the semiconductor fins 12. In embodiments of the invention, portions of the conductive gate 70 in non-channel regions of the structure 200 are recessed via, e.g., chamfering, to help reduce gate resistance.

The conductive gate 70 can be made of any suitable gate material, as described above. A top spacer 72 can be formed over the conductive gate 70. The top spacer 72 can include a dielectric material, such as silicon oxide, silicon nitride, silicon oxynitride, or a combination thereof, and can be formed using a deposition process such as, for example, GCIB, in a similar manner as the second bottom spacers 50. In embodiments of the invention, the top spacer 72 can include a same material as the first bottom spacers 40 and/or the second bottom spacers 50.

An ILD 74 can be deposited over the structure 200, for example, to fill regions between the semiconductor fins 12. The ILD 74 can be any suitable dielectric material, such as, for example, a silicon oxide.

The ILD 74 can be polished using, for example, CMP selective to the top spacer 72. The CMP process can be utilized to remove excess portions of ILD 74 such that the upper surface of ILD 74 is coplanar with the upper surface of the top spacer 72. In embodiments of the invention, the material of ILD 74 is chosen such that portion of the top spacer 72 and the hard mask 14 can be removed selective to the ILD 74 during a subsequent etching.

A portion of the top spacer 72 and the hard mask 14 is removed to expose portions of the semiconductor fins 12. Top S/D regions 75 are then formed on the exposed portions of the semiconductor fins 12.

The top S/D regions 75 can be an epitaxial silicon layer epitaxially grown using known processes, as described above. A conductive contact 76 is formed in ohmic contact with electrically-active areas of the substrate 10. The conductive contact 76 can be formed using known metallization techniques. For example, in embodiments of the invention, the ILD 74 is extended and then patterned with open trenches. The conductive contact 76 is then deposited into the trenches. In embodiments of the invention, the conductive contact 76 is overfilled into the trenches, forming overburdens above a surface of the ILD 74. In embodiments of the invention, a CMP selective to the ILD 74 removes the overburden. The conductive contact 76 can be made of any suitable conducting material, as described above.

Local interconnect lines 78, 79 in ohmic contact with the top S/D regions 75 are also formed. The local interconnect lines 78, 79 can be formed using known metallization techniques, and can be made of a similar material as the conductive contact 76. As depicted in FIG. 14, local interconnect line 78 is formed in ohmic contact with two adjacent top S/D regions 75 and adjacent local interconnect line 79 is formed in ohmic contact with one top S/D region 75. In embodiments of the invention, the local interconnect lines 78, 79 can be merged together.

As depicted in FIG. 14, the second bottom spacers 50 can have a thickness that is greater than a thickness of the first bottom spacers 40. The greater thickness of the second bottom spacer 50 as compared to the first bottom spacers 40 can result in a stepped bottom spacer, e.g., the combination of a first bottom spacer 40 and a second bottom spacer 50. The stepped bottom spacer can increase a distance separating portions of the conductive gate 70 in non-channel regions, e.g., regions not on one or more sidewalls of the semiconductor fins 12, from the heavily doped region 22, which can serve as a bottom S/D region, and a parasitic capacitance of the structure 200 can be decreased. Comparing FIGS. 7 and 14, the structure 100 depicted in FIG. 7 can provide low power in comparison to the structure 200 depicted in FIG. 14, which can provide high performance.

In embodiments of the invention, the second bottom spacers 50 can have a thickness that is less than (not depicted) a thickness of the first bottom spacers 40. In embodiments of the invention, the second bottom spacers 50 can have varying thickness, for example, varying thicknesses greater than the second bottom spacers 50, or some of the second bottom spacers 50 can have a thickness less than a thickness of the first bottom spacers 40, while others of the second bottom spacers 50 can have a thickness greater than a thickness of the first bottom spacers 40.

Thus it can be seen from the foregoing detailed description that technical effects and benefits can be provided to a VFET-based logic or SRAM device. In particular, such devices can be formed to include VFETs having uniform bottom spacers.

Various embodiments of the present invention are described herein with reference to the related drawings. Alternative embodiments of the invention can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), CVD, electrochemical deposition (ECD), molecular beam epitaxy (MBE) and more recently, ALD among others. Removal/etching is any process that removes material from the wafer. Examples include etch processes (either wet or dry), and CMP, and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a semiconductor fin over a first surface of a substrate;
    forming sacrificial spacers on a first side of the semiconductor fin and a second side of the semiconductor fin, the first side of the semiconductor fin opposing the second side of the semiconductor fin;
    recessing the first surface of the substrate to expose a second surface of the substrate and a third surface of the substrate;
    recessing the second surface of the substrate to form a first cavity between a first portion of the sacrificial spacers and the substrate on the first side of the semiconductor fin;
    recessing the third surface of the substrate to form a second cavity between a second portion of the sacrificial spacers and the substrate on the second side of the semiconductor fin;
    forming a first bottom spacer in the first cavity; and
    forming a second bottom spacer in the second cavity;
    wherein a thickness of the first bottom spacer in a direction between the first portion of the sacrificial spacers and the substrate is substantially equal to a thickness of the second bottom spacer in a direction between the second portion of the sacrificial spacers and the substrate.

2. The method of claim 1, wherein each of the first bottom spacer and the second bottom spacer comprises silicon nitride.

3. The method of claim 1 further comprising removing the sacrificial spacers.

4. The method of claim 3 further comprising forming a conductive gate contacting the semiconductor fin.

5. The method of claim 1, wherein each of the second surface of the substrate and the third surface of the substrate is substantially perpendicular to the first surface of the substrate.

6. The method of claim 1, wherein an underlying surface of the substrate is exposed after recessing the second surface of the substrate.

7. The method of claim 6, wherein the underlying surface of the substrate is substantially parallel to the first surface of the substrate.

8. The method of claim 7 further comprising forming a third bottom spacer on the underlying surface of the substrate.

9. The method of claim 8, wherein the thickness of the first bottom spacer is less than a thickness of the third bottom spacer in the direction between the first portion of the sacrificial spacers and the substrate.

10. The method of claim 8, wherein the thickness of the first bottom spacer is greater than a thickness of the third bottom spacer in the direction between the first portion of the sacrificial spacers and the substrate.

11. The method of claim 8, wherein the third bottom spacer comprises silicon oxide, silicon nitride, or silicon oxynitride.

12. The method of claim 1, wherein a width of the first bottom spacer in a direction orthogonal to the between the first portion of the sacrificial spacers and the substrate is substantially equal to a width of the first portion of the sacrificial spacers on the first side of the semiconductor fin in the direction orthogonal to the direction between the first portion of the sacrificial spacers and the substrate.

13. The method of claim 1, wherein a width of the first bottom spacer in a direction orthogonal to the direction between the first portion of the sacrificial spacers and the substrate is less than a width of the first portion of the sacrificial spacers on the first side of the semiconductor fin in the direction orthogonal to the direction between the first portion of the sacrificial spacers and the substrate.

* * * * *